United States Patent
Quek

(10) Patent No.: US 10,762,256 B2
(45) Date of Patent: Sep. 1, 2020

(54) HAND-DRAWN LADDER LOGIC CONVERSION METHOD AND SYSTEM

(71) Applicant: Rockwell Automation Asia Pacific Business Center Pte. Ltd., Singapore (SG)

(72) Inventor: Shiou Liang Quek, Singapore (SG)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 726 days.

(21) Appl. No.: 15/471,764

(22) Filed: Mar. 28, 2017

(65) Prior Publication Data

US 2018/0284713 A1    Oct. 4, 2018

(51) Int. Cl.
| | |
|---|---|
| G05B 11/01 | (2006.01) |
| G06F 30/30 | (2020.01) |
| G05B 19/05 | (2006.01) |
| G06K 9/00 | (2006.01) |
| G06F 3/00 | (2006.01) |

(52) U.S. Cl.
CPC ........... *G06F 30/30* (2020.01); *G05B 19/056* (2013.01); *G06F 3/00* (2013.01); *G06K 9/00402* (2013.01); *G06K 9/00476* (2013.01); *G05B 2219/23293* (2013.01)

(58) Field of Classification Search
CPC ........................................................ G06F 3/00
USPC ............................................................ 700/18
See application file for complete search history.

(56) References Cited

U.S. PATENT DOCUMENTS

| | | | | |
|---|---|---|---|---|
| 6,580,953 | B1* | 6/2003 | Wiebe ................ | G05B 19/0428 700/17 |
| 2006/0155393 | A1* | 7/2006 | Klein ................... | G05B 19/056 700/18 |
| 2010/0256785 | A1* | 10/2010 | Lloyd .................. | G05B 19/056 700/83 |
| 2014/0313216 | A1* | 10/2014 | Steingrimsson ... | G06K 9/00402 345/589 |
| 2018/0144189 | A1* | 5/2018 | Tran ........................ | G06T 11/20 |

* cited by examiner

*Primary Examiner* — Md Azad
(74) *Attorney, Agent, or Firm* — Fletcher Yoder, P.C.

(57) ABSTRACT

A system includes an operator interface that includes a screen on which a ladder logic diagram is displayed. The system also includes an input device that may be used to draw a hand-drawn ladder logic component in the ladder logic diagram on the screen. Additionally, the system includes memory circuitry that stores ladder logic programming code and processing circuitry that executes the ladder logic programming code. The ladder logic programming code executed by the processing circuitry includes a recognition module to recognize the hand-drawn ladder logic component and a conversion module to convert the recognized hand-drawn ladder logic component to a standard graphical format and to a standard programming object.

20 Claims, 4 Drawing Sheets

HAND-DRAWN LADDER LOGIC CONVERSION METHOD AND SYSTEM

BACKGROUND

The present application relates generally to the field of automation control systems. More specifically, the present application relates to techniques for recognizing hand-drawn ladder logic diagrams and symbols and converting such diagrams and symbols for utilization by an automation control system.

Many automation applications rely on encoded logic for execution of monitoring and control functions, from motor or actuator monitoring and control to complex system oversight and control. Traditional switchgear and associated devices were hard-wired based upon circuit designs expressed in "ladder logic", which represented components by standard symbols, and relationships between components by lines generally extending from a vertical power line on one side and a vertical ground or reference potential line on an opposite side. Power and signal routes thus corresponded to "rungs" of a ladder-like representation. Such diagrams are still extremely well understood and play an important role in wiring and programming automation systems.

Modern programming techniques, however, have tended to adopt computer-assisted diagramming platforms in which the only inputs available are by keyboard or other computer input tools. These can prove quite rigid and constrained in many cases, and there is a need for improved and more flexible techniques that allow for input of ladder logic components and relationships, and for interpretation of these for processing of initial designs, as well as for design modification.

BRIEF DESCRIPTION

In one embodiment, a system includes an operator interface that includes a screen on which a ladder logic diagram is displayed. The system also includes an input device that may be used to draw a hand-drawn ladder logic component in the ladder logic diagram on the screen. Additionally, the system includes memory circuitry that stores ladder logic programming code and processing circuitry that executes the ladder logic programming code. The ladder logic programming code executed by the processing circuitry includes a recognition module to recognize the hand-drawn ladder logic component and a conversion module to convert the recognized hand-drawn ladder logic component to a standard graphical format and to a standard programming object.

In another embodiment, a system includes an operator interface that includes a screen on which a ladder logic diagram is displayed. The system also includes an input device that may be used to draw a hand-drawn ladder logic component in the ladder logic diagram on the screen. Additionally, the system includes memory circuitry that stores ladder logic programming code and processing circuitry that executes the ladder logic programming code. The ladder logic programming code executed by the processing circuitry includes a recognition module to recognize the hand-drawn ladder logic component and a conversion module to convert the recognized hand-drawn ladder logic component to a standard graphical format and to a standard programming object. The system also includes an industrial automation device that includes automation device memory circuitry that receives the standard programming object as well as processing circuitry that executes the standard programming object to control a system or process.

In yet another embodiment, a method includes receiving a hand-drawn ladder logic component on a ladder logic diagram via a screen on which the ladder logic diagram is displayed. The method also includes executing, via a programming computer, a recognition module to recognize the hand-drawn ladder logic component. Moreover, the method includes executing, via the programming computer, a conversion module to convert the recognized hand-drawn ladder logic component to a standard graphical format and to a standard programming object.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Ladder logic may be used to program automation control systems as well as components of automation systems controlled by automation control systems. Generally, the ladder logic is first hand-drawn by an operator of the automation control system and subsequently implemented into the automation control systems via software. For example, an operator may draw ladder a ladder logic diagram on paper and then use software to draw the ladder logic diagram on a computer and program the components of the ladder logic diagram. The presently disclosed techniques allow for an operator to hand draw ladder logic diagrams on a screen, have the hand-drawn ladder logic be recognized and converted by a computing device into a standard graphical format and a standard programming object that may be programmed and used to operate and/or control an automation system and/or components thereof.

Figure 1:
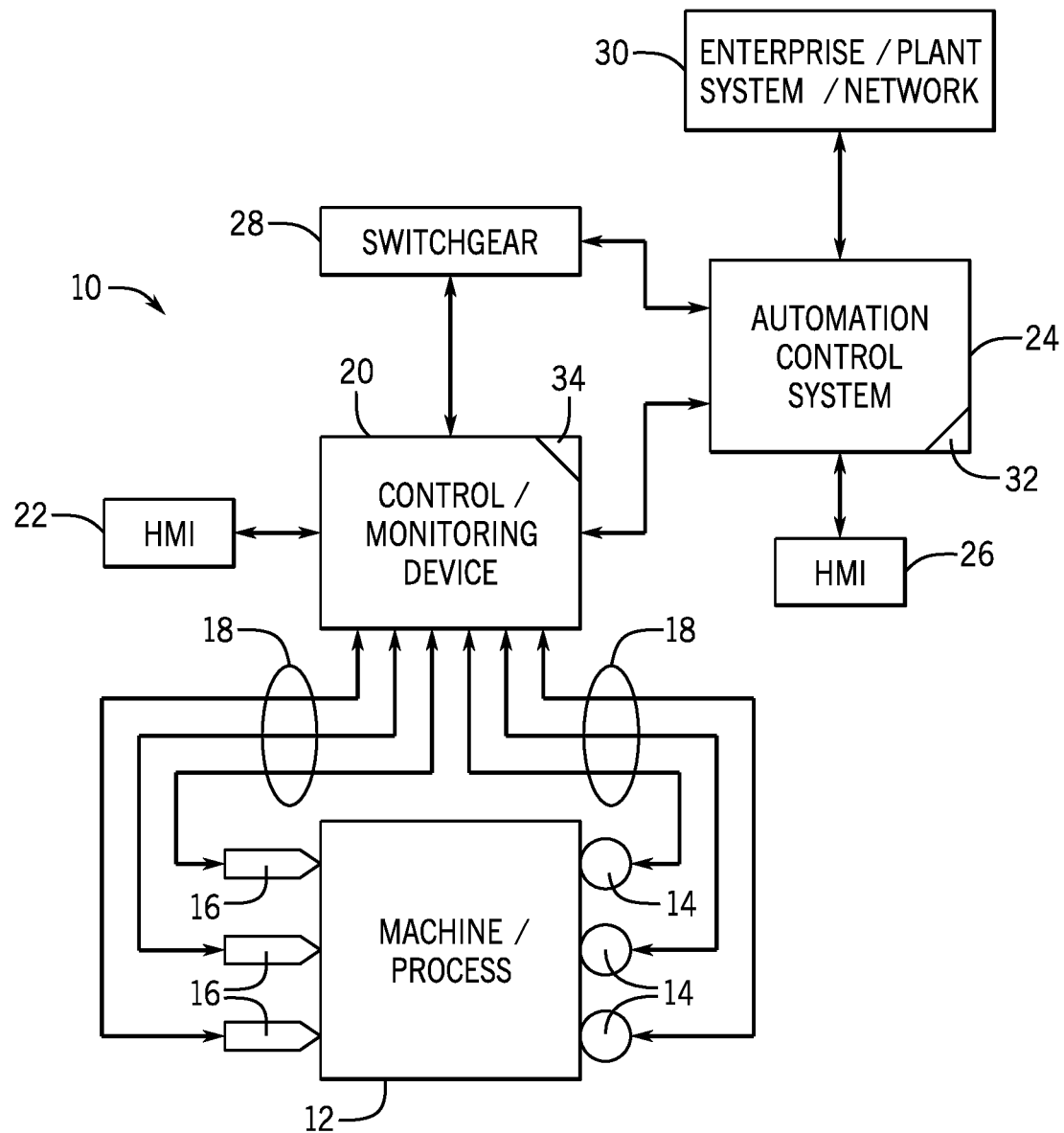
FIG. 1 is a diagrammatical representation of an exemplary automation system in accordance with embodiments of the present techniques.

By way of introduction, FIG. 1 illustrates an exemplary diagrammatical representation of an automation system 10. The automation system 10 may be include a machine/process 12. The machine/process 12 may take many forms and include devices for accomplishing many different and varied purposes. For example, the machine/process 12 may include a compressor station, an oil refinery, a batch operation for making food items, and a mechanized assembly line. Accordingly, the machine/process 12 may include a variety of operational components, such as electric motors, valves, actuators, temperature elements, sensors, or a myriad of manufacturing, processing, material handling, and other applications. Further, the machine/process 12 may comprise control and monitoring equipment for regulating process variables through automation and/or observation.

For example, the illustrated machine/process 12 has actuators 14 and sensors 16. The actuators 14 may include one or more devices adapted to perform a mechanical action in response to a signal from a control/monitoring device 20. The sensors 16 may include one or more devices that may provide information regarding the operation and/or conditions of the machine/process 12 to the control/monitoring device 20. The sensors 16 and actuators 14 may be utilized to operate process equipment such as the machine/process 12. Indeed, they may be utilized within process loops that are monitored and controlled by the control/monitoring device 20 and/or a human-machine interface (HMI) 22 of the control/monitoring device 20. Such a process loop may be activated based on process inputs (e.g., input from one of the sensors 16) or direct operator input received via the HMI 22.

As illustrated, the actuators 14 and sensors 16 are in communication with the control/monitoring device 20 and may be assigned a particular address in the control/monitoring device 20 that is accessible by the HMI 22. As illustrated, the actuators 14 and sensors 16 may communicate with the control/monitoring device 20 via one or more I/O devices 18 coupled to the control/monitoring device 20. The I/O devices 18 may transfer input and output signals between the control/monitoring device 20 and the machine/process 12. The I/O devices 18 may be integrated with the control/monitoring device 20, or may be added or removed via expansion slots, bays or other suitable mechanisms. The I/O devices 18 may serve as an electrical interface to the control/monitoring device 20 and may be located proximate or remote from the control/monitoring device 20, including remote network interfaces to associated systems.

Additionally, the control/monitoring device 20 may be communicatively coupled to an automation control system 24 and send and receive data to and from the automation control system 24. The automation control system 24 may monitor and control an enterprise/plant system/network 30. For example, the automation control system 24 may receive date from the enterprise/plant system/network 30 and send commands to the enterprise/plant system/network 30 based on the received data. The enterprise/plant system/network 30 may include machines and/or processes, groupings of machines and/or processes, and/or networks of automation machines and/or automated devices. For example, the enterprise/plant system/network 30 may include one or more assembly lines, a factory, a processing plant, or the like.

Similar to the control/monitoring device 20, the automation control system 24 may have a HMI 26 through which an operator may monitor and control the automation control system 24. Additionally, as discussed in more detail in relation to FIG. 2, the control/monitoring device 20 and the automation control system 24 may include various components that allow for ladder logic to be executed by the control/monitoring device 20, the automation control system 24, and any components of the automation system 10 (e.g., machine/process 12 and enterprise/plant system/network 30).

Additionally, the automation system 10 may include switchgear 28 that is coupled to the control/monitoring device 20 and the automation control system 24. The switchgear 28 may include fuses, circuit breakers, contactors, and electrical disconnect switches. Moreover, the switchgear 28 may be used to stop the flow of electricity between the control/monitoring device 20 and the automation control system 24 as well as any components of the automation system 10 that share are coupled to the control/monitoring device 20 and the automation control system 24.

Moreover, the control/monitoring devices 20 and the automation control system 24 may include programming 32, 34. The programming 32, 34 may include software and/or instructions that can be utilized in the controlling and monitoring of the machine/process 12 and/or the enterprise/plant system/network 30. For example, the programming may include software and instructions that allow input from an operator to be carried out by the control/monitoring device 20 and/or the automation control system 24. Furthermore, the programming 32, 34 may be used by the control/monitoring device 20 and/or the automation control system 24 in order to execute ladder logic programming code that can be used to control components of the automation system 10.

Figure 2:
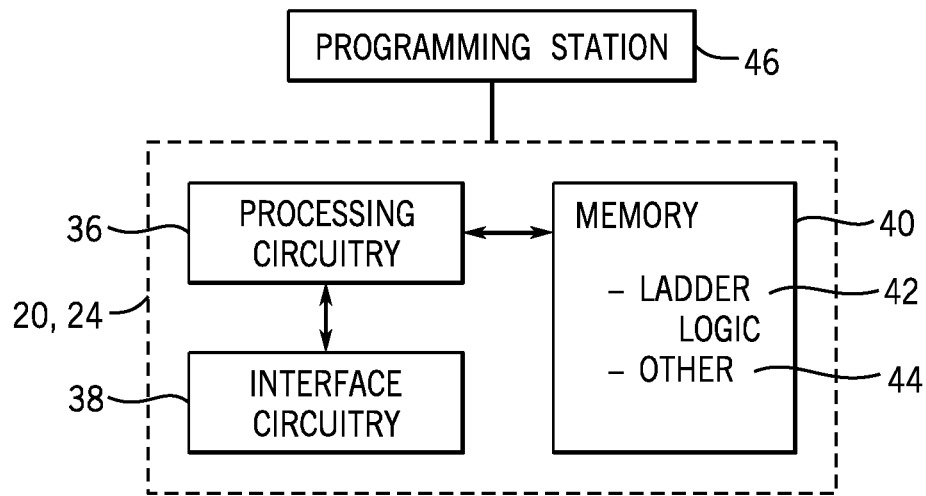
FIG. 2 is a schematic view of the control/monitoring device and/or the automation control system of FIG. 1 in accordance with embodiments of the present techniques.

Referring now to FIG. 2, which is a schematic view of the control/monitoring device 20 and/or the automation control system 24 of FIG. 1 in accordance with embodiments of the present techniques, the control/monitoring device 20 and the automation control system 24 may include several components. For instance, the control/monitoring device 20 and the automation control system 24 may include processing circuitry 36. The processing circuitry 36 includes one or more computer processors or microprocessors capable of executing computer-executable code and making calculations and/or determinations based on data received from the sensors 16 and/or the enterprise/plant system/network 30. Moreover, the processing circuitry 36 may also receive data from interface circuitry 38. That is, the processing circuitry may receive data from the sensors 16 and/or the enterprise/plant system/network via the interface circuitry 38, which may be one or more processors or microprocessors capable of executing computer-executable code. In addition to receiving data from the sensors 16 and/or enterprise/plant system/network 30, the interface circuitry 38 may send commands to the actuators 14 and/or the enterprise/plant system/network 30 based on the calculations and determinations made by the processing circuitry 36. For example, one of the sensors 16 may send data regarding the machine/process 12 to the processing circuitry 36, the processing circuitry 36 may determine that that the data corresponds to a condition, and the interface circuitry 38 may send a command to one or more of the actuators 14 to change an operational parameter of the machine/process 14 in order to address and/or ameliorate the condition.

The control/monitoring device 20 and the automation control system 24 may also include memory 40. The memory 40 may represent non-transitory computer-readable media (i.e., any suitable form of memory or storage) that may store the processor-executable code used by the processing circuitry 36 and/or the interface circuitry 38 to perform various techniques described herein. It should be noted that non-transitory merely indicates that the media is tangible and not a signal. Additionally, the memory 40 may store various data that can be utilized by the processing circuitry 36, the interface circuitry 38, the control/monitoring device 20, and/or the automation control system 24. For instance, the memory 40 may include ladder logic data 42 that may be implemented by the control/monitoring device 20 and/or the automation control system 24. More specifically, the ladder logic data 42 may be received via operator input, stored on the memory 40, and utilized by the processing circuitry 36 and interface circuitry 38 to execute the ladder logic within the automation system 10. The ladder logic data 42 may include programs, algorithms, and/or instructions for interpreting and executing ladder logic. The control/monitoring device 20 and the automation control system 24 may receive input from an operator relating to ladder logic that the operator want to use on the automation system 10. The processing circuitry 36 of the control/monitoring device 20 and the automation control system 24 may utilize the ladder logic data 42 in order to make determinations related to the ladder logic input from the operator, including execution of the ladder logic input within the automation system 10. Additionally, the memory 40 may include other data 44. The other data 44 may include various data, algorithms, routines, and/or instructions that may be utilized by the processing circuitry 36. For example, the other data 33 could include formulas used to make calculations by the processing circuitry 36.

Furthermore, the control/monitoring device 20 and the automation control system 24 may be communicatively coupled to a programming station 46. In some embodiments, the programming station 46 may be physically coupled to control/monitoring device 20 and/or the automation control system 24 via a wired connection, while in other embodiments, the programming station 46 may be communicatively coupled to the control/monitoring device 20 and/or the automation control system 24 via a wireless connection. Yet, in other embodiments, the programming station 46 may be communicatively coupled to the control/monitoring device 20 and/or the automation control system 24 via both a wired and a wireless connection. An operator may utilize the programming station 46 to program the automation system 10 and/or components of the automation system 10. More specifically, the programming station 46 includes an interface that may be used by an operator to program the control/monitoring device 20 and/or the automation control system 24. For example, as discussed in more detail below, an operator may enter ladder logic diagrams and components of ladder logic diagrams to be utilized by the automation system 10 and/or components of the automation system 10 via the programming station 46. It should be noted that, while the present discussion relates to a single programming station 46, more than one programming station 46 may be utilized. For example, one programming station 46 may be coupled to the control/monitoring device 20, and a second programming station 46 may be coupled to the automation control system 24.

Figure 3:
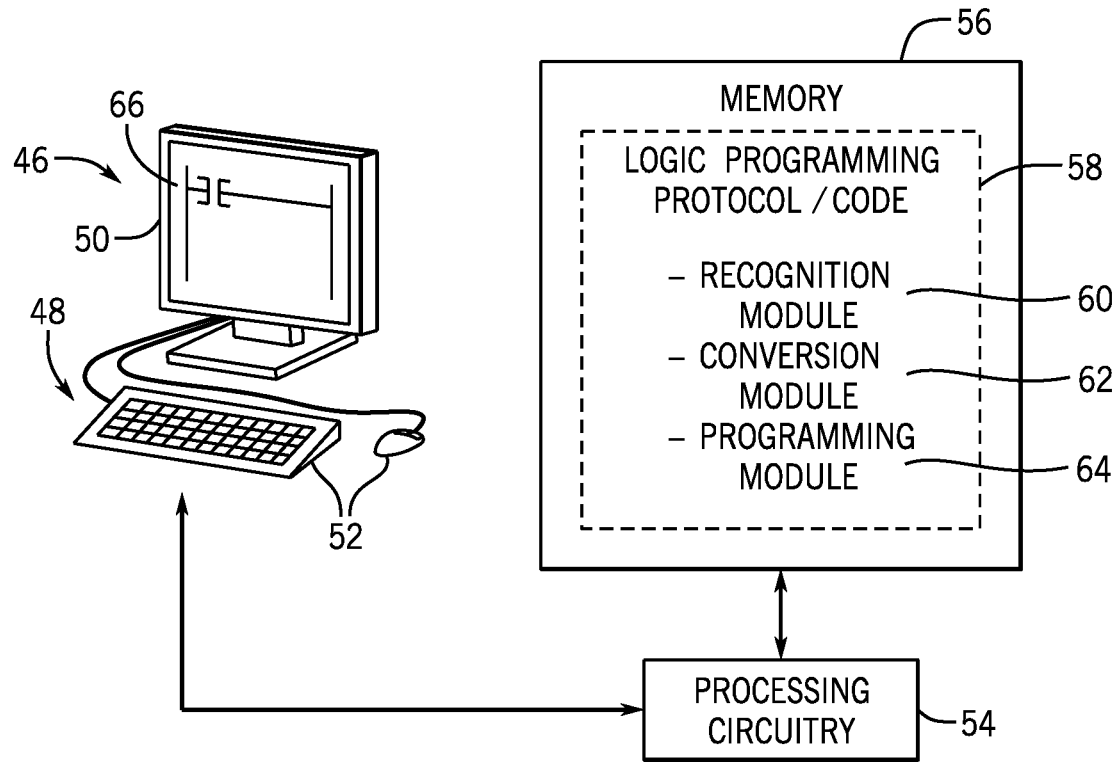
FIG. 3 is a schematic view of the programming station of FIG. 2 in accordance with embodiments of the present techniques.

With the foregoing in mind, FIG. 3 is a schematic view of the programming station 46 of FIG. 2 in accordance with embodiments of the present techniques. As discussed above, the programming station 46 may include an operator interface 48 that may be utilized by an operator to program the control/monitoring device 20 and/or the automation control system 24. It should be noted that the operator interface 48 may be any suitable device from which an operator may program the control/monitoring device 20 and/or the automation control system 24. For example, the operator interface 48 may be a computer, tablet, smartphone, or any other thick client, thin client, or ultra-thin client.

The operator interface 48 includes a screen 50 that may display various content and information to the operator. The screen 50 may be any suitable device that can display information. For instance, the screen 50 may be a screen of a computer monitor, tablet, smartphone, and/or similar devices. That is, in some embodiments, the screen 50 may be a touch screen. Furthermore, the operator interface 48 includes one or more input devices 52 with which the operator may make inputs into the operator interface 48. As shown in FIG. 3, the input devices 52 may include a computer keyboard and/or a mouse. However, in other embodiments, the input devices 52 may include a stylus, finger, and/or any suitable means to input information into the operator interface 48. For instance, in embodiments in which the screen 50 is a touch screen, the operator may use a stylus, his or her finger, and/or any other suitable means to interact with the touch screen.

The operator interface 48 may also be communicatively coupled to processing circuitry 54 that may make determinations and calculations based on operator input data received via the input devices 52. The processing circuitry 54 may include one or more processors or microprocessors capable of executing computer-executable code. Moreover, the processing circuitry 54 may be included within operator interface 48, be separate from the operator interface 48, or a combination thereof. For example, in embodiments in which the operator interface 48 is a thick client, the processing circuitry 54 is at least partially included within the operator interface 48. That is, one or more processors of the processing circuitry 54 may be located within the operator interface 48, yet the operator interface 48 may utilize one or more processors of the processing circuitry 48 that are external and communicatively coupled to the operator interface 48. However, in embodiments in which the operator interface 48 is an ultra-thin client, the processing circuitry 48 may be separate from the operator interface 48, and the operator interface 48 may be communicatively coupled to one or more processors of the processing circuitry 54. In any case, operator input data may be conveyed to the processing circuitry 54 via a wired or wireless connection, and the processing circuitry 54 may process the operator input data.

The operator interface 48 may also be communicatively coupled to memory circuitry 56, which may represent non-transitory computer-readable media (i.e., any suitable form of memory or storage) that may store code or data executed by the processing circuitry 54. Similar to the processing circuitry 54, in some embodiments, the operator interface 48 may include the memory circuitry 56, while in other embodiments, the memory circuitry 56 may not be included in the operator interface 48. Additionally, the memory circuitry 56 may include various data that can be utilized by the processing circuitry 54 and the operator interface 48. For example, the memory circuitry 56 includes ladder logic programming code 58. As described below, the ladder logic programming code 58 may be utilized to recognize and convert ladder logic drawn on the screen 50 into a standard graphical format as well as standard programming objects that, when executed, may be used to operate and control the automation system 10 and/or one or more components of the automation system 10.

The ladder logic programming code 58 includes various modules that may be used to recognize and/or interpret ladder logic diagrams and/or components of ladder logic diagrams drawn by the operator on the screen 50. The modules may also allow for hand-drawn ladder logic diagrams and components of ladder logic diagrams to be converted into programming objects. As discussed in greater detail below, the programming objects may have attributes and/or properties that can be associated with the automation system 10 and/or the components of the automation system 10.

The ladder logic programming code 58 may include a recognition module 58. The recognition module 58 may include data, code, algorithms, and/or instructions that may be utilized by the processing circuitry 54 in order to recognize input from the operator. In other words, the processing circuitry 54 may be able to recognize drawings of ladder logic diagrams and components of ladder logic diagrams drawn on the screen 50 by the operator by using the data of the recognition module 60. For example, the operator may draw a horizontal line, and the processing circuitry 54, by accessing the recognition module 60, may recognize the horizontal line as a rung to be added to a ladder logic diagram. The operator may also draw other components of ladder logic diagrams, and the hand-drawn ladder logic diagram components may be recognized by the operator interface. Examples of recognizable components include inputs (e.g., contacts, switches, and/or relays) and outputs (e.g., actuators, solenoids, indicators, and/or coils) of the ladder logic diagram.

The ladder logic programming code 58 may also include a conversion module 62 that includes data that the processing circuitry 54 may utilize in order to convert a recognized hand-drawn ladder logic diagram component to a standard graphical format. Continuing with the example given above of the horizontal hand-drawn line that was recognized to be a rung, the horizontal line may be converted into a standard horizontal line generated by the operator interface 48 and displayed on the screen 50. As another example, the operator may draw an input or output (with a general designation (e.g., "( )" for an output) and/or a specific designation (e.g., a drawing representative of a pushbutton). In some embodiments, the hand-drawn component of the ladder logic diagram may be replaced by the standard graphical format. As discussed in more detail in relation to FIG. 4, other ladder logic diagram components may be drawn by an operator and subsequently recognized and converted by the processing circuitry 54.

Furthermore, the hand-drawn ladder logic components may be converted into a standard graphical format drawn from a library of standard graphical formats. For example, an operator may draw a component of a ladder logic diagram, the processing circuitry 54 may recognize that the hand-drawn component corresponds to an actuator, and the operator interface 48 may convert the hand-drawn component to a standard graphical depiction of an actuator that is stored in a library of standard graphical formats. Also, the library of standard graphical formats may be stored on the memory circuitry 56, and an operator may edit the library. That is, the operator may add, delete or otherwise modify the library of standard graphical formats.

Additionally, the conversion module 62 includes data, such as code, protocols, and instructions that may be utilized by the processing circuitry 54 to convert ladder logic diagrams and components of ladder logic diagrams drawn by the operator into programming objects. For example, programming objects may correspond to each of the operator inputs that the recognition module 60 may be utilized to recognize. In other words, recognized ladder logic diagram components may correspond to programming objects. Similar to the standard graphical formats, the programming objects may be selected from a library of standard programming objects that is stored on the memory circuitry 56. The library of standard programming objects may be modified by the operator. For instance, the operator may add new programming objects, delete programming objects, and modify properties of programming objects. Additionally, the programming objects have corresponding data that can be stored on the memory circuitry 56. For example, the programming objects may include properties and/or attributes that may be received and/or modified by operator input. Moreover, the properties and/or attributes of a particular programming object may be predefined and stored on the memory circuitry 56 such that once an instantiation of the programming object occurs, the programming object includes the predefined properties and/or attributes.

The programming objects may correspond to components of the automation system 10 and define functionalities of the components of the automation system 10. For example, hand-drawn ladder logic component corresponding to an output may be recognized and converted into a programming object that corresponds to the output. More specifically, the object may correspond to one of the actuators 14, the control/monitoring device 20, the automation control system 24, the switchgear 28, and components thereof. For instance, one object may define the functionality of a switch, breaker, fuse, or other component of the switchgear 28. One or more objects generated by the processing circuitry 54 by executing the conversion module may be sent to and received by the control/monitoring device 20 and/or the automation control system 24. The control/monitoring device 20 and the automation control system 24 may execute (e.g., via the processing circuitry 36 and/or the interface circuitry 38) the one or more programming objects to control a system or process (e.g., the automation system 10 or one or more components of the automation system 10 such as the machine/process 12, one or more actuators 14, one or more components of the switchgear 28, and/or the enterprise/plant system/network 30).

The conversion module 62 may also include data, that when executed by the processing circuitry 54, creates links to other programming objects. The data may be associated with one or more objects. Also, the data may provide methods or procedures that may define a relationship between two or more objects. For example, there may be an object representative of an input such as a contactor, relay, or switch, an object representative of an output such as an actuator or indicator light, and the data of the conversion module 62 may denote that when the input is received, the output performs an action (e.g., when the position of a switch is switched, an actuator performs an action or an indicator light turns on or off). Furthermore, the data may allow for links representative of power flow in the automation system (i.e., power flow links). For instance, the power flow links may define a relationship of how power is connected or flows from between two components of the automation system 10 that are represented and defined by objects. As another example, the links may be power flow links of a power source to a common reference potential (e.g., ground).

The ladder logic programming code 58 may also include a programming module 64. The programming module 64 may include programming tools that are displayed on the screen 50. For example, the programming tools may be used to edit the objects representative of ladder logic diagram components (i.e., an operator may edit properties of the objects via the programming tools of programming module 64). For instance, an operator may have drawn a ladder logic diagram component, and the processing circuitry 54 may have recognized the component, converted the component, and displayed a ladder logic diagram 66 with the component on the screen 50. The programming module 64 may allow the operator to edit the ladder logic diagram 66. For example, as discussed above, the ladder logic diagram may include programming objects; the operator may utilize the programming module 64 in order to edit the properties and/or attributes of the programming objects. Additionally, the operator may use the programming module 64 in order to delete ladder logic diagram components.

Figure 4:
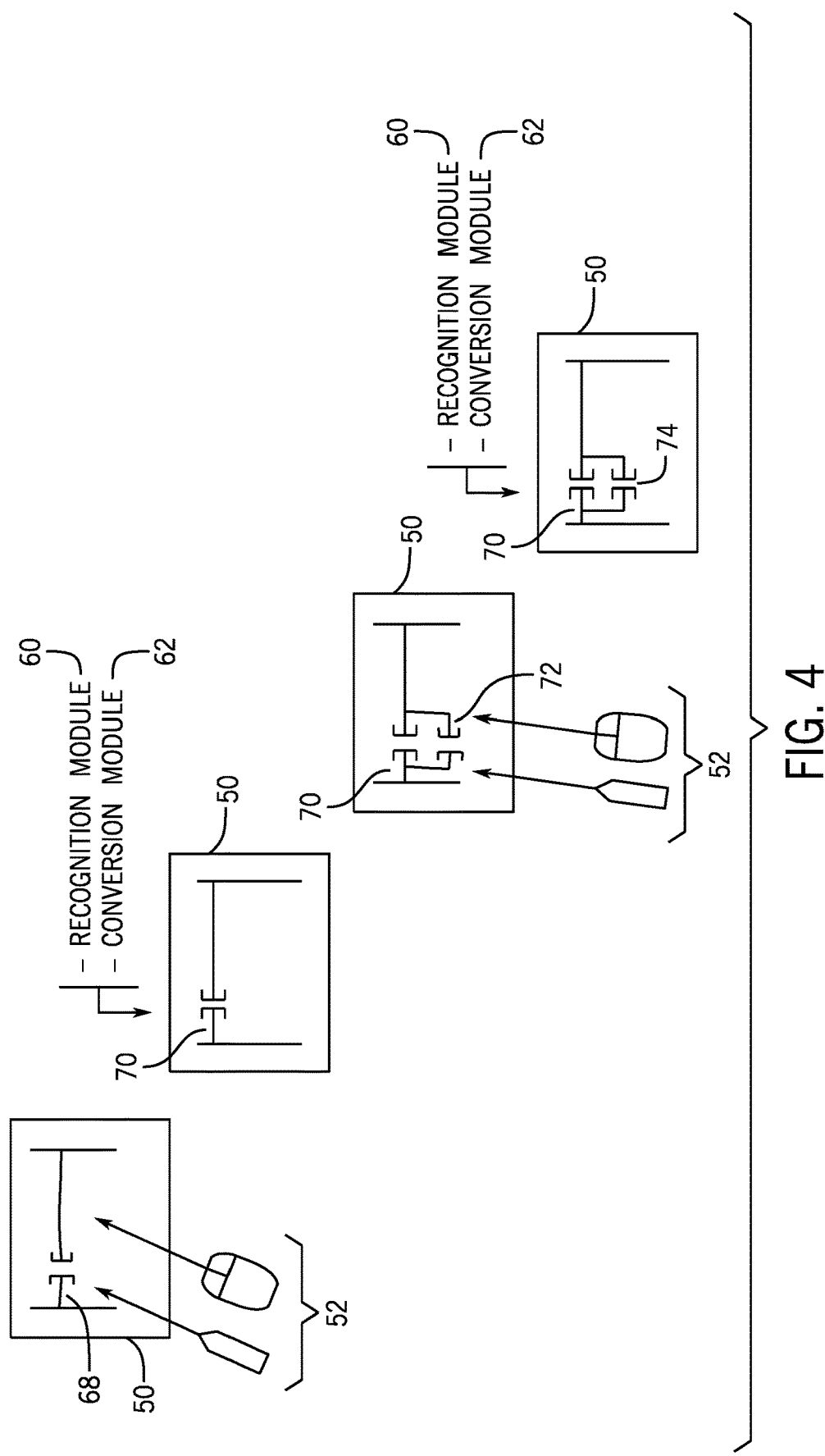
FIG. 4 is a diagrammatical representation of ladder logic that is drawn, recognized, and converted in accordance with embodiments of the present techniques.

With the foregoing in mind, FIG. 4 is a diagrammatical representation of ladder logic that is drawn, recognized, and converted in accordance with embodiments of the present techniques. Using at least one of the input devices 52, the operator may draw a hand-drawn component 68 of a ladder logic diagram onto the screen 50 of the operator interface 48. The hand-drawn component 68 may be recognized via the processing circuitry 54 executing the recognition module 60. As illustrated, the hand-drawn component 68 may be recognized as a new rung and an input on the new rung. Additionally, the hand-drawn component 68 may be converted to a standard graphical format and a standard object as described above. As illustrated, the hand-drawn component 68 may be recognized, converted, and replaced with a recognized and converted component 70 that is displayed on the screen 50. As discussed above, the recognized and converted component 70 may be selected from the libraries of standard graphical formats and standard programming objects. For example, the graphical format of the recognized and converted component 70 displayed on the screen 50 may have been selected from a library of standard graphical formats, and the recognized and converted component 70 may include one or more programming objects chosen from a library of standard programming objects.

The operator may continue to modify a ladder logic diagram on the screen 50. For example, using one or more of the input devices 52, the operator may add a second hand-drawn component 72. As illustrated, the second hand-drawn component 72 is an input that was drawn in parallel with the recognized and converted component 70. The processing circuitry 54 may execute the recognition module 60 and the conversion module 62, resulting in a second recognized and converted component 74. That is, via execution of the recognition module 60 and the conversion module 62, the second hand-drawn component may be recognized and converted into a standard graphical format and a standard programming object.

While the illustrations and discussion of FIG. 4 relate to two inputs on a rung of a ladder logic diagram, it should be noted that other ladder logic components may be drawn by an operator, recognized and converted by the processing circuitry 54 via execution of the recognition module 60 and conversion module 62, and programmed by the operator via the programming module 62. For example, the operator may draw more than one rung, one or more inputs, and/or one or more outputs to a ladder logic diagram. The processing circuitry 54 may recognize and convert the drawn ladder logic components into a standard graphical format and one or more standard programming objects, and the operator may modify the object(s).

As described above, by executing the programming module 64, the operator may edit properties of the programming objects generated via execution of the conversion module 62. As also described above, the programming objects may be executed by the processing circuitry 36 and/or the interface circuitry 38 of the control/monitoring device 20 and the automation control system 24. Thus, an operator may draw a ladder logic diagram, the processing circuitry 54, via execution of the recognition module 60 and the conversion module 62, may convert the ladder logic diagram and its components into a standard graphical format and into standard programming objects. The operator may edit data of the objects, such as properties of the objects (e.g., links between other objects), via the programming module 64, and the objects may be sent to, and executed by, the control/monitoring device 20 and the automation control system 24 to control and/or operate the automation system 10 and components thereof. Thus, an operator may draw ladder logic onto the screen 50 of the operator interface 48, and that ladder logic may be implemented to operate and control the automation system 10 and/or one or more components of the automation system 10.

Figure 5:
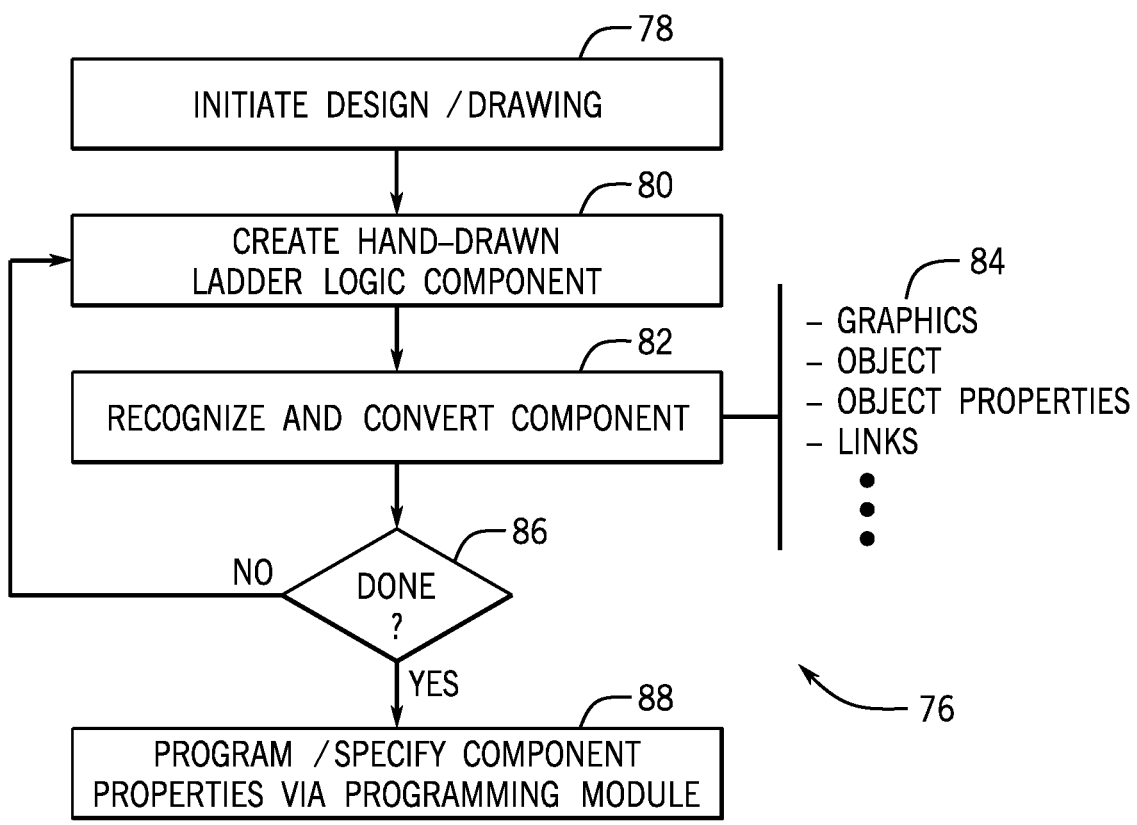
FIG. 5 is a flow chart of a method for recognizing and converting hand-drawn ladder logic in accordance with embodiments of the present techniques.

FIG. 5 is a flow chart of a method 76 for recognizing and converting hand-drawn ladder logic in accordance with embodiments of the present techniques. In block 78, a design/drawing may be initiated. For example, an operator may open access the programming module 66 of the operator interface 48. Turning now to block 80, an operator may create a hand-drawn ladder logic component. As discussed above, the hand-drawn ladder logic component may be drawn on the screen 50 of the operator interface 48 using the input devices 52.

At block 82, the processing circuitry 54 of the operator interface 48 may recognize and convert the hand-drawn ladder logic component into a standard programming object as well as a standard graphical format by executing the recognition module 60 and the conversion module 62 of the ladder logic programming code 58 as discussed above. Also, as discussed above, the recognized and converted ladder logic components may be associated with various data 84. The data 84 may include the standard graphic format and the programming object to which the hand-drawn ladder logic component was converted. The data 84 may also include programming object properties of the programming object. For example, the programming object may have predefined or default properties, and the data 84 may reflect the predefined and default properties of the programming object.

Moreover, the data 84 may also include data that may be used for linking programming objects. For example, the link data may be utilized by a linker to combine the programming objects into executable files, a library of standard programming objects, or other programming objects. In other words, the programming objects may be combined into executable files, one or more libraries of programming objects, and other programming objects. For instance, an executable file of the programming objects may be executed via the processing circuitry 54 to run, control, and/or define operational parameters of the automation system 10 and/or components of the automation system 10 (e.g., machine/process 12, actuators 14, sensors 16, control/monitoring device 20, automation control system 24, and/or switchgear 28). Moreover, a library of standard programming objects may include one or more programming objects, and a hand-drawn ladder logic component may be converted to one or more of the programming objects of the library. Additionally, the programming objects may be combined to form another programming object. For instance, referring back to FIG. 4, there may be one programming object for the recognized and converted component 70, a second programming object for recognized and converted component 74, a third programming object for an output (e.g., representative of one or more of the actuators 14 and/or a component of the switchgear 28), and the three programming objects may be combined to make another object (i.e., an object for a logical "OR" function).

Returning to FIG. 5, at decision block 86, the processing circuitry 54 may determine whether the hand-drawn ladder logic component has been recognized and converted as described above in regard to block 80. If the processing circuitry 54 determines that the hand-drawn ladder logic component has not been recognized and converted, the method 76 may return to block 80. For example, if the operator draws something that is not recognized by the processing circuitry 54, the operator may then make another drawing.

However, if the processing circuitry 54 determines that the hand-drawn ladder logic component has been recognized and converted, the method 76 may continue to block 88. At block 88, the operator may program and/or specify ladder logic component properties via the programming module 64. In other words, using one or more of the input devices 52, the operator may select a ladder logic component that is displayed on the screen 50 and modify properties of the component. For instance, the operator may define the component in terms of whether the component is an input or output, and the operator may also define the component in terms of a component of the automation system 10. For example, referring back to FIG. 4, the operator may define the recognized and converted components 70 and 74 as inputs, and may further associate the inputs with the sensors 16.

Returning to FIG. 5, it should be noted that block 86 may also refer to the processing circuitry 54 determining whether the operator has finished entering inputs into the operator interface 48. That is, the processing circuitry 54 may determine whether the operator has finished drawing ladder logic components. If the processing circuitry 54 decides this in the negative, then the method 76 may return to block 80, and the operator may continue to draw ladder logic components. However, if the processing circuitry 54 determines that the operator has finished drawing ladder logic components, at block 88, the operator may program and/or specify properties of the recognized and converted ladder logic components as discussed above.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system comprising:
    memory circuitry that stores ladder logic programming code;
    an operator interface comprising a screen on which a ladder logic diagram generated based on the ladder logic programming code is displayed;
    an input device to draw a hand-drawn ladder logic component to be added into the ladder logic diagram on the screen; and
    processing circuitry that executes the ladder logic programming code, the ladder logic programming code executed by the processing circuitry comprising a recognition module to recognize the hand-drawn ladder logic component, and a conversion module to convert the recognized hand-drawn ladder logic component to:
    a component to be added into the ladder logic diagram, wherein the component is represented in a graphical format of the ladder logic programming code; and
    a programming object to be added into the ladder logic programming code, wherein the programming object corresponds to an automation component of an automation system.

2. The system of claim 1, wherein the input device comprises a computer mouse or stylus.

3. The system of claim 1, wherein the conversion module replaces the hand-drawn ladder logic component with the graphical format drawn from a library of graphical formats.

4. The system of claim 1, wherein the conversion module selects the programming object from a library of ladder logic objects.

5. The system of claim 4, wherein the ladder logic objects comprise software objects defining functionality of switchgear components of the automation system.

6. The system of claim 1, wherein the conversion module creates links to other programming objects of the ladder logic diagram.

7. The system of claim 6, wherein the links comprise power flow links from a power source to a common reference potential.

8. The system of claim 1, comprising a graphic-based programming protocol to further configure the programming object to carry out an automation operation via the automation component.

9. A system comprising:
    memory circuitry that stores ladder logic programming code;
    an operator interface comprising a screen on which a ladder logic diagram generated from the ladder logic programming code is displayed;
    an input device to draw a hand-drawn ladder logic component to be added into the ladder logic diagram on the screen;
    processing circuitry that executes the ladder logic programming code, the ladder logic programming code executed by the processing circuitry comprising a recognition module to recognize the hand-drawn ladder logic component, and a conversion module to convert the recognized hand-drawn ladder logic component to:
    a component to be added into the ladder logic diagram, wherein the component is represented in a graphical format of the ladder logic programming code; and
    a programming object to be added into the ladder logic programming code, wherein the programming object corresponds to an automation component of an automation system; and
    an industrial automation device comprising automation device memory circuitry that receives the programming object and processing circuitry that executes the programming object to control the automation component of an industrial automation system corresponding to the programming object.

10. The system of claim 9, wherein the conversion module replaces the hand-drawn ladder logic component with the graphical format drawn from a library graphical formats.

11. The system of claim 9, wherein the conversion module selects the programming object from a library of ladder logic objects.

12. The system of claim 10, wherein the ladder logic objects comprise software objects defining functionality of switchgear components of the automation system.

13. The system of claim 9, wherein the conversion module creates links to other programming objects of the ladder logic diagram.

14. The system of claim 13, wherein the links comprise power flow links from a power source to a common reference potential.

15. A method comprising:

receiving a hand-drawn ladder logic component on a ladder logic diagram via a screen on which the ladder logic diagram is displayed;

executing, via a programming computer, a recognition module to recognize the hand-drawn ladder logic component; and executing, via the programming computer, a conversion module to convert the recognized hand-drawn ladder logic component to:

a component to be added into the ladder logic diagram, wherein the component is represented in a graphical format of ladder logic programming code; and a programming object to be added into the ladder logic programming code, wherein the programming object corresponds to an automation component of an automation system.

16. The method of claim 15, wherein the hand-drawn ladder logic component is input by an operator via an input device.

17. The method of claim 15, comprising transferring the converted ladder logic component to an industrial automation device and executing the programming object to control a system or process.

18. The method of claim 15, wherein the conversion module replaces the hand-drawn ladder logic component with the graphical format drawn from a library of graphical formats.

19. The method of claim 18, wherein the conversion module selects the programming object from a library of ladder logic objects.

20. The method of claim 19, wherein the ladder logic objects comprise software objects defining functionality of switchgear components of the automation system.

\* \* \* \* \*